(12) United States Patent
Nolleck et al.

(10) Patent No.: US 8,028,405 B2
(45) Date of Patent: Oct. 4, 2011

(54) DEVICE AND METHOD FOR FITTING PRINTED CIRCUIT BOARDS WITH CONTACT PINS

(75) Inventors: Holger Nolleck, Dinkelsbuehl (DE); Juergen Dommel, Stoedtlen-Gaxhardt (DE); Dietmar Reissig, Herrieden (DE)

(73) Assignee: Tyco Electronics AMP GmbH, Bensheim (DE)

( * ) Notice: Subject to any disclaimer, the term of this patent is extended or adjusted under 35 U.S.C. 154(b) by 0 days.

(21) Appl. No.: 12/734,617

(22) PCT Filed: Nov. 6, 2008

(86) PCT No.: PCT/EP2008/009378
§ 371 (c)(1),
(2), (4) Date: May 12, 2010

(87) PCT Pub. No.: WO2009/100743
PCT Pub. Date: Aug. 20, 2009

(65) Prior Publication Data
US 2010/0306998 A1 Dec. 9, 2010

(30) Foreign Application Priority Data
Nov. 13, 2007 (DE) .......................... 10 2007 054 454

(51) Int. Cl.
*H01R 9/00* (2006.01)
*B23P 19/00* (2006.01)

(52) U.S. Cl. .................. 29/842; 29/739; 29/759; 29/845

(58) Field of Classification Search .................... 29/739, 29/759, 842, 845
See application file for complete search history.

(56) References Cited

U.S. PATENT DOCUMENTS

| 4,384,334 A | * | 5/1983 | Tateishi et al. | ................ 318/569 |
| 4,819,178 A | * | 4/1989 | Isayama et al. | ................ 702/107 |
| 5,548,537 A | * | 8/1996 | Taguchi | .......................... 702/85 |

* cited by examiner

*Primary Examiner* — C. J Arbes
(74) *Attorney, Agent, or Firm* — Baker & Daniels LLP

(57) ABSTRACT

A device for fitting printed circuit boards (5) with contact pins (7), comprising at least one insertion device (1) for inserting at least one contact pin (7) into a printed circuit board (5), at least one measuring device (3) for measuring the angle of insertion (θ) between the at least one inserted contact pin (7) and the printed circuit board (5), wherein the measuring device (3) comprises a sensor assembly (9) having at least two sensors (11) arranged at different heights above the printed circuit board (5) in such a way that the contact pins (7) can be detected by the sensors (11). At least one of the sensor assemblies (9) and the printed circuit board (5) are capable of being displaced in a plane parallel to the printed circuit board (5). The angle of insertion (θ), between the contact pin (7) and the printed circuit board (5), is determined using the relative speed between the printed circuit board (5) and the sensor assembly (9) and from the time difference for the sensors (11) to detect the contact pins (7). The measuring device (3) may connect to the insertion device (1) in such a way that a resulting measurement, taken by the measuring device (3), may be transmitted to the insertion device (1), which is capable of readjustment in response to the transmitted resulting measurement.

13 Claims, 2 Drawing Sheets

DEVICE AND METHOD FOR FITTING PRINTED CIRCUIT BOARDS WITH CONTACT PINS

The invention is related to a device and a method for fitting printed circuit boards with contact pins.

When fitting printed circuit boards with contact pins and other contact elements, what is known as a circumference of wobble is an essential quality feature. The circumference of wobble may be the position of the contact tip inside a circle, which surrounds the centre point of the hole into which the contact is inserted. Due to numerous parameters production with a constant circumference of wobble is not possible. According to the state of the art, once the printed circuit boards have been test fitted, matrices are randomly lowered over the inserted contact pins in order to check the position of the tips of the pins. However, this can only determine if the circumference of wobble, of the inserted contact pins, is below the tolerance limits specified by the test matrices. If these limits are exceeded, the printed circuit board is rejected and can no longer be used.

DE 39 29 478 A1 discloses a method and a device for measuring the connecting wires of electronic components, the components being guided at a known speed past a light barrier. However, the method and device disclosed are not able to fix faulty connecting wires or avoid the production of components with faulty connecting wires.

An object of the present invention is to avoid creating faults when inserting contact pins into printed circuit boards.

This objective is achieved using a device for fitting printed circuit boards with contact pins, according to independent claim 1 and a method for fitting printed circuit boards with contact pins according to independent claim 9.

According to the invention, a device for fitting printed circuit boards with contact pins comprises at least one insertion device for inserting at least one contact pin into a printed circuit board. Furthermore, the device comprises at least one measuring device for measuring the angle of insertion between the at least one inserted contact pin and the printed circuit board. The measuring device has a sensor assembly with at least two sensors arranged at different heights above the printed circuit board in such a way that the contact pin can be detected by the sensors. The sensor assembly and/or the printed circuit board is/are displaceable in a plane parallel to the printed circuit board. This is performed in such a way that the sensor assembly and the printed circuit board are movable relative to one another. The angle of insertion between the contact pin and the printed circuit board can be determined from the relative speed between the printed circuit board and the sensor assembly, as well as from the time difference for the sensors to detect the contact pins. The measuring device is connected to the insertion device in such a way that the resulting measurement, taken by the measuring device, may be transmitted to the insertion device. The insertion device may be readjusted in response to the transmitted resulting measurement.

According to the invention, the method for fitting printed circuit boards with contact pins comprises inserting the contact pins using an insertion device and measuring the angle of insertion of the inserted contact pins using a measuring device. The measuring device comprises a sensor assembly having at least two sensors arranged at different heights above the printed circuit board in such a way that they detect the contact pins. The sensor assembly and/or the printed circuit board is/are displaced in a plane parallel to the printed circuit board so the sensor assembly and the printed circuit board move relative to one another. The angle of insertion between the contact pin and the printed circuit board is determined from the relative speed of motion between the contact pin and the printed circuit board, as well as the time difference for the detection of the contact pin by the sensors arranged at different heights. The resulting measurement, taken by the measuring device, is transmitted to the insertion device and the insertion device is readjusted in response to the transmitted measurement.

According to the invention, a device and method for fitting printed circuit boards with contact pins allows the angle between each inserted contact pin and the printed circuit board to be determined. A deviation of the angle, between the contact pin and the printed circuit board from a pre-determined value, can thus be detected early and, in response thereto. The insertion device can be readjusted early enough that no fault is produced.

In one embodiment, two sensors are arranged in a common plane, which is arranged at a right angle to the printed circuit board. Consequently, the angle of the contact pin can be determined in a particularly simple manner since the spacing of the sensors in a plane parallel to the printed circuit board does not have to be considered.

In one embodiment, the sensor assembly is stationary and the printed circuit board is displaceable. An assembly of this type allows the measurement to be taken while the printed circuit board is transported to a further processing station. No additional time is necessary for the measurement. Moreover, a stationary measuring assembly can be particularly easily wired and precisely adjusted.

In an alternative embodiment, the printed circuit board is stationary and the sensor assembly is displaceable. This embodiment is particularly suitable for large printed circuit boards, which can only be moved in a highly complex procedure and at a constant speed.

In a further embodiment, both the sensor assembly and the printed circuit board are displaceable. Consequently, the measurement can be taken particularly quickly since the respective speeds of the printed circuit board and the sensor assembly are added together.

In a further embodiment, the measuring device comprises at least two sensor assemblies. As a result, a plurality of contact pins can be measured at the same time.

In a further embodiment, the measuring device comprises a two-dimensional matrix of sensor assemblies, which is arranged in a plane parallel to the printed circuit board. Consequently, a plurality of contact pins can be measured at the same time.

In one embodiment, at least one sensor assembly is rotatable about an axis which is perpendicular to the printed circuit board. At least one of the sensor assemblies and the printed circuit board are displaceable in at lest two different directions, which are not parallel to one another. Consequently, the inclination of the contact pin may be determined relative to the printed circuit board in at least two different planes, and the angular position of the contact pin can thus be determined relative to the printed circuit board.

In one embodiment, at least one of the sensors is configured as a light barrier. A light barrier is a sensor, which can be produced in a simple and cost-effective manner.

The light barrier may be configured as an interruption light barrier, in which the contact pin interrupts a light beam, or a reflection light barrier, in which the contact pin reflects a light beam. The light beam may be a visible light beam or a beam in the wave range close to visible light, in particular an infrared light beam.

In one embodiment, the procedure for fitting printed circuit boards with contact pins comprises comparing the measured angle of insertion with a pre-determined angle of insertion and readjusting the insertion device if the difference between the measured angle of insertion and the pre-determined angle of insertion exceeds a pre-determined tolerance limit.

In other words, the pre-determined angle defines a circumference of wobble surrounding the pre-determined angle of insertion. If the tip of the inserted contact pin lies outside the circumference of wobble, the insertion device is readjusted.

In a further embodiment, an inner circumference of wobble is arranged inside an outer circumference of wobble. The outer circumference of wobble corresponds to the maximum permissible deviation of the angle of insertion from the pre-determined angle of insertion. If the tip of the contact pin lies outside the outer circumference of wobble, the printed circuit board cannot be used further. The inner circumference of wobble is arranged at a sufficient distance inside the outer circumference of wobble and the insertion process is readjusted if the measured angular position of the contact pin is outside the inner circumference of wobble. The insertion process is thus readjusted early enough that the tip of the inserted contact pin never lies outside the outer circumference of wobble.

In one embodiment of the method, at least one of the sensor assemblies and the printed circuit board is displaced in a first direction parallel to the printed circuit board in a first step. This is performed in order to determine the angle of insertion between the contact pin and the printed circuit board in a first plane, which is not parallel to the plane of the printed circuit board. Next, in a second step, the sensor device is rotated about an axis which is perpendicular to the printed circuit board. In a third step, at least one of the sensor assemblies and the printed circuit board is displaced in a second direction parallel to the printed circuit board. The second direction comprising an angle to the first direction which is greater than zero. Again, this is performed in order to determine the angle of insertion between the contact pin and the printed circuit board in a second plane, which is neither parallel to the first plane nor parallel to the plane of the printed circuit board. By determining the angle of insertion of the contact pin in two planes, which are not parallel to one another and which are not parallel to the plane of the printed circuit board, the angular position of the contact pin can be fully determined.

In one embodiment, the angle between the first direction and the second direction is 90°. Consequently, the method can be carried out in a particularly simple and clear manner.

The invention will be described in greater detail hereinafter with reference to the embodiment shown in the figures, in which.

In the following description of the figures, indications such as above, below, left, right, perpendicular and horizontal refer solely to the illustrations of the embodiment shown in the respective figures.

Figure 1:
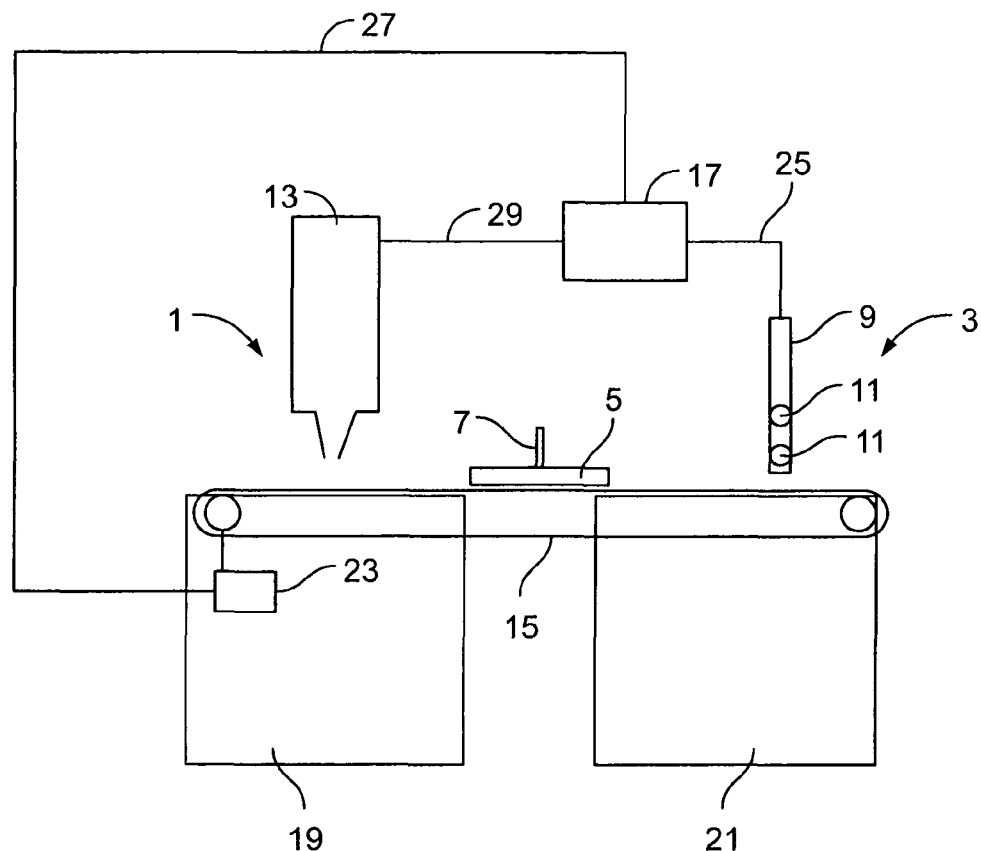
FIG. 1 is a schematic side view of a device for fitting printed circuit boards with an insertion device, including a measuring device according to the invention.

FIG. 1 is a schematic side view of a device according to the invention for fitting printed circuit boards.

On the left-hand side, the device comprises an insertion device 1 for inserting contact pins 7 into printed circuit boards 5. The insertion device 1 comprises a first base 19 and a conveyor belt 15 extending horizontally, on which a printed circuit board 5 is arranged horizontally. Above the conveyor belt 15, an insertion machine 13 is arranged that inserts contact pins 7 into the printed circuit board 5.

The conveyor belt 15 extends to the right-hand side beyond the insertion device 1 towards the measuring device 3, enabling the printed circuit board 5 to be transported from the insertion device 1 to the measuring device 3. Optionally, the printed circuit board 5 may be transported to further processing stations (not shown in FIG. 1).

The measuring device consists of a second base 21 which is configured similarly to the first base 19 of the insertion device 1. In particular, the convey- or belt 15 also extends over the upper region of the second base 21. A sensor assembly 9, having two sensors 11, is fitted above the conveyor belt 15. The sensors 11 are arranged above one another in a plane, which is perpendicular to the plane in which the conveyor belt 15 and the printed circuit board 5 extend. The sensors 11 of the sensor assembly 9 are electrically connected to an evaluation device 17 through a signal line 25. The evaluation device 17 is electrically connected through a control line 27, in order to a drive 23 of the conveyor belt 15, which is arranged in the first base 19.

The evaluation device 17 determines the angle of insertion, between the contact pin 7 and the printed circuit board 5, using measurements of the conveyor belt 15 speed and the time difference for the detection of the contact pin 7 by the sensors 11, arranged at different heights.

The evaluation device 17 compares the determined angle of insertion in this manner with a pre-determined angle. If the difference between the measured angle and the pre-determined angle exceeds a pre-determined tolerance limit, the evaluation device 17 sends a signal through an adjustment line 29 to the insertion machine 13 in order to readjust the insertion machine 13. For example, the angle between the insertion machine 13 and the printed circuit board 5 and/or the position of the insertion machine 13 in a plane parallel to the printed circuit board 5 may be changed.

Figure 2:
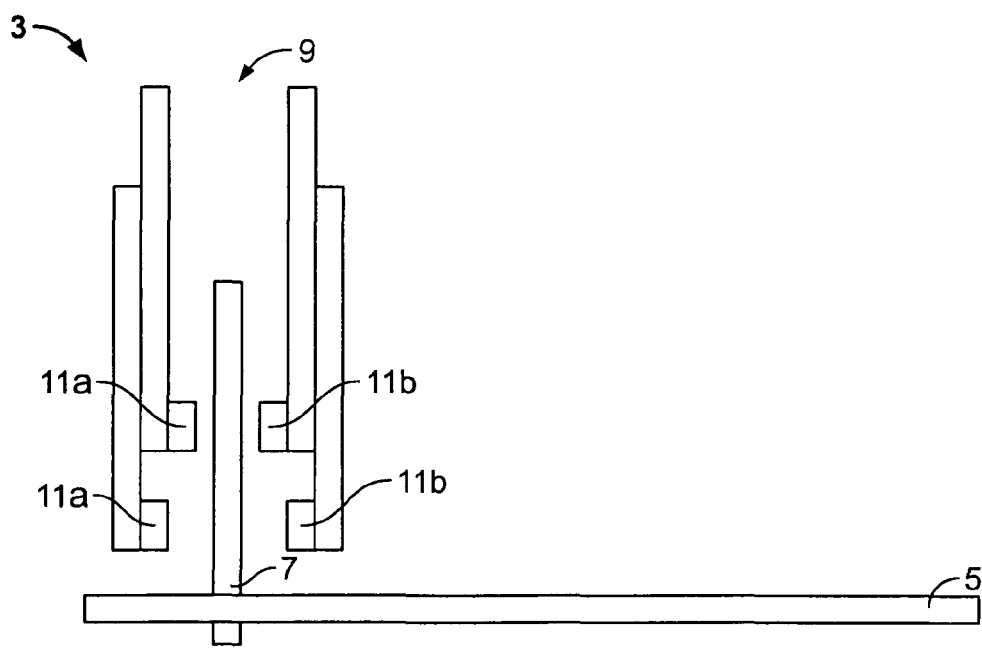
FIG. 2 is a side view of the cooperation between a sensor assembly and a contact pin inserted into a printed circuit board.

FIG. 2 is an enlarged side view showing the interaction between the sensors 11, of the sensor assembly 9, and a contact pin 7 that is inserted into a printed circuit board 5. FIG. 2 is a view with the line of vision in a direction of transportation of the conveyor belt 15 from FIG. 1. That is to say, the plane of the printed circuit board 5, in this view, extends perpendicular to the plane of projection. The sensor assembly 9 comprises two sensors 11, specifically, interruption light barriers, which are arranged above one another and each having a light source 11a and a light sensor 11b. The light sources 11a and the light sensors 11b are each arranged perpendicularly above one another in a plane, which is perpendicular to the plane of the printed circuit board 5. The printed circuit board 5, with the contact pin 7, is displaced in a direction perpendicular to the plane of projection. In this case, the light barriers are interrupted when the contact pin 7 enters the region between the light barriers.

Figure 3:
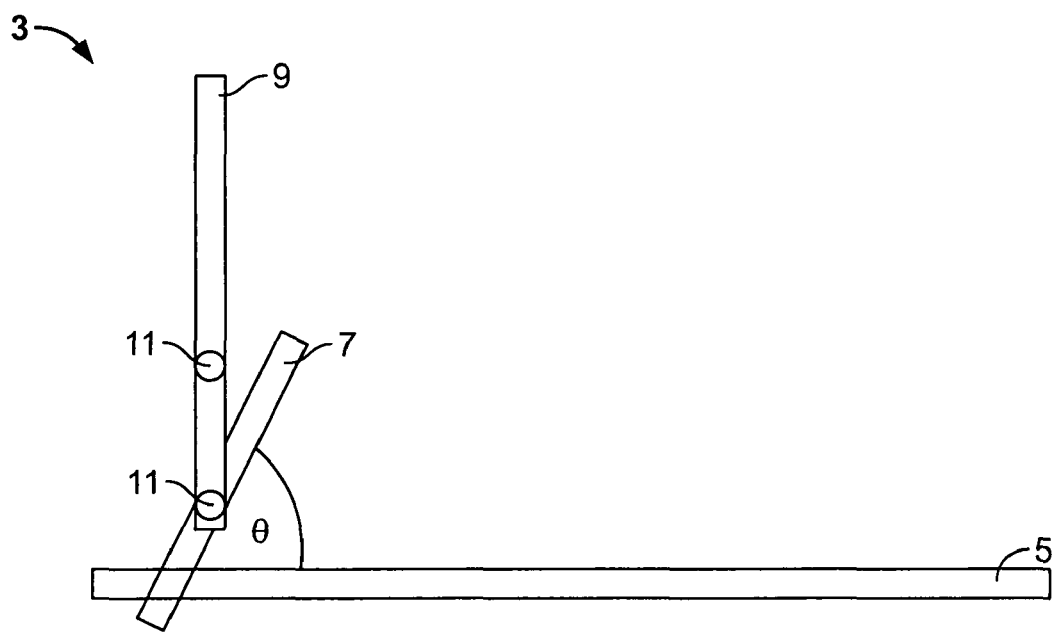
FIG. 3 shows the cooperation of the sensor assembly in FIG. 2 from a side perspective turned 90°.

FIG. 3 is an enlarged side view of the sensor assembly 9, the printed circuit board 5 and the contact pin 7 in a side view rotated through 90° with respect to that of FIG. 2 and corresponds to the view shown in FIG. 1. The printed circuit board 5, with the contact pin 7, is moved in a horizontal direction parallel to the plane of projection, for example from left to right relative to the sensor assembly 9. Alternatively or in addition, the sensor assembly 9 may also be moved relative to a stationary printed circuit board, for example from right to left.

If the angle of insertion θ, between the contact pin 7 and the printed circuit board 5, is exactly 90°, the two light barriers are interrupted at the same time when the contact pin 7 enters the region of the sensor assembly 9. If the angle of insertion θ of the contact pin 7 deviates from 90°, the two light barriers 11 are each interrupted at a different time. The angle of insertion θ, between the printed circuit board 5 and the contact pin 7, is determined from the difference in the interruption of the two light barriers and the known relative speed between the printed circuit board 5 and the sensor assembly 9.

If the deviation of the measured value of the angle of insertion θ exceeds a pre-determined value of a pre-determined tolerance limit, the insertion device 1 is readjusted in order to avoid faults being produced.

Figure 4:
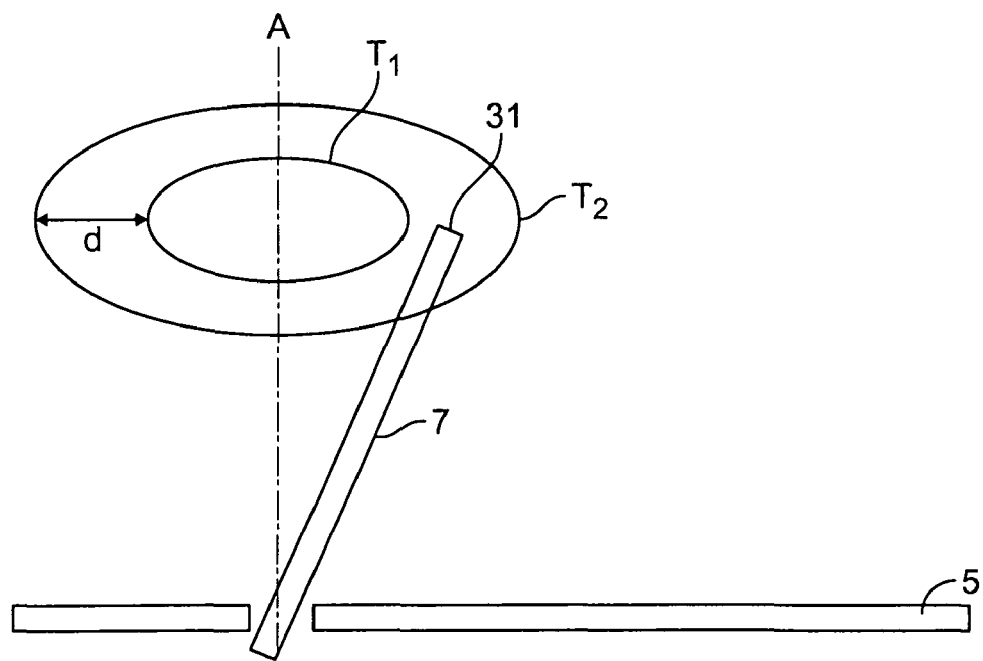
FIG. 4 is a schematic view of the arrangement of an outer circumference of wobble and an inner circumference of wobble surrounding the ideal position of a contact pin.

FIG. 4 is a schematic view of the arrangement of an outer circumference of wobble T1 and an inner circumference of wobble T2. The two circumferences of wobble T1 and T2 are arranged coaxially about the axis A, which represents the pre-determined ideal angle of insertion, in this example 90°, of the contact pin 7 into the printed circuit board 5. The outer circumference of wobble T1 corresponds to the maximum permissible deviation of the angular position of the contact pin from the pre-determined ideal position. If the tip 31 of the contact pin 7 lies outside the outer circumference of wobble T1, the printed circuit board 5 cannot be used further. The inner circumference of wobble T2 is arranged at a suitable distance d inside the outer circumference of wobble T1 and the insertion process is readjusted if the tip 31 of the contact pin 7 lies outside the inner circumference of wobble T2. Consequently, the insertion process is readjusted early enough to prevent the contact pin 7 being inserted in such a way that its tip 31 lies outside the outer circumference of wobble T1.

The invention claimed is:

1. A method for fitting printed circuit boards with contact pins, comprising:
    inserting the contact pins using an insertion device,
    measuring the angle of insertion (θ) of the inserted contact pins using a measuring device comprising a sensor assembly having at least two sensors arranged at different heights above the printed circuit board in such a way that they detect the contact pins,
    wherein at least one of the sensor assembly and the printed circuit board is displaced in a plane parallel to the printed circuit board and the angle of insertion (θ) between the contact pin and the printed circuit board is determined from the relative speed of motion between the contact pin and the printed circuit board and the time difference for the detection of the contact pin by the sensors,
    a resulting measurement taken by the measuring device being transmitted to the insertion device, and the insertion device being readjusted in response to the transmitted resulting measurement.

2. The method according to claim 1, wherein, in a first step, at least one of the sensor assembly and the printed circuit board is displaced in a first direction parallel to the printed circuit board in order to determine the angle of insertion (θ) between the contact pin and the printed circuit board in a first plane which is not parallel to the plane of the printed circuit board,
    in a second step, the sensor device is rotated at an angle (Ö) about an axis arranged perpendicular to the printed circuit board, and
    in a third step, at least one of the sensor assembly and the printed circuit board is displaced in a second direction parallel to the printed circuit board, the second direction being at an angle (Ö) to the first direction, said angle being greater than zero,
    in order to determine the angle of insertion (θ) between the contact pin and the printed circuit board in a second plane which is not parallel to the plane of the printed circuit board.

3. The method according to claim 2, wherein the angle (Ö) is 90°.

4. A device for fitting printed circuit boards with contact pins, comprising
    at least one insertion device for inserting at least one contact pin into a printed circuit board,
    at least one measuring device for measuring the angle of insertion (θ) between at least one inserted contact pin and the printed circuit board, wherein the measuring device comprises a sensor assembly having at least two sensors arranged at different heights above the printed circuit board in such a way that the contact pin can be detected by the sensors;
    at least one of the sensor assembly or the printed circuit board being displaceable in a plane parallel to the printed circuit board;
    the angle of insertion (θ) between the contact pin and the printed circuit board determinable from the relative speed between the printed circuit board and the sensor assembly and from the time difference for the detection of the contact pin by the sensors;
    the measuring device being connected to the insertion device in such a way that a resulting measurement taken by the measuring device may be transmitted to the insertion device, and
    the insertion device capable of readjustment in response to the transmitted resulting measurement.

5. The device according to claim 4, wherein the two sensors are arranged in a common plane perpendicular to the printed circuit board.

6. The device according to claim 4, wherein the printed circuit board is displaceable.

7. The device according to claim 4, wherein the sensor assembly is displaceable.

8. The device according to claim 4, wherein the measuring device comprises at least two sensor assemblies.

9. The device according to claim 4, wherein the measuring device comprises a two-dimensional matrix of sensor assemblies, the matrix being arranged in a plane parallel to the printed circuit board.

10. The device according to claim 4, wherein at least one sensor assembly is rotatable about an axis arranged perpendicular to the printed circuit board.

11. The device according to claim 4, wherein at least one of the sensor assemblies and the printed circuit board is displaceable in two different directions which are not parallel to one another.

12. The device according to claim 4, wherein at least one of the sensors is configured as a light barrier.

13. The method according to claim 1, wherein the method comprises comparing the measured angle of insertion (θ) with a pre-determined tolerance limit (Ä), and the insertion device is readjusted if the difference between the measured angle of insertion (θ) exceeds a pre-determined tolerance limit (Ä).

* * * * *